United States Patent
Govil et al.

(10) Patent No.: US 6,922,230 B2
(45) Date of Patent: *Jul. 26, 2005

(54) DUV SCANNER LINEWIDTH CONTROL BY MASK ERROR FACTOR COMPENSATION

(75) Inventors: Pradeep K. Govil, Norwalk, CT (US); James Tsacoyeanes, Southbury, CT (US)

(73) Assignee: ASML Holding N.V., Veldhoven (NL)

( * ) Notice: Subject to any disclaimer, the term of this patent is extended or adjusted under 35 U.S.C. 154(b) by 67 days.

This patent is subject to a terminal disclaimer.

(21) Appl. No.: 10/419,101

(22) Filed: Apr. 21, 2003

(65) Prior Publication Data

US 2004/0066496 A1 Apr. 8, 2004

Related U.S. Application Data

(63) Continuation of application No. 09/826,214, filed on Apr. 4, 2001, now Pat. No. 6,573,975.

(51) Int. Cl.$^7$ ................. G03B 27/42; G03B 27/54; G03B 27/72
(52) U.S. Cl. ................. 355/53; 355/67; 355/71
(58) Field of Search ................. 355/52, 53, 67, 355/69, 71; 430/30

(56) References Cited

U.S. PATENT DOCUMENTS

| 5,296,892 A | 3/1994 | Mori |
| 5,329,336 A | 7/1994 | Hirano et al. |
| 5,357,312 A | 10/1994 | Tounai |
| 5,383,000 A | 1/1995 | Michaloski et al. |
| 5,621,498 A | 4/1997 | Inoue et al. ................. 355/67 |
| 5,631,721 A | 5/1997 | Stanton et al. |
| 5,642,183 A | 6/1997 | Sugihara et al. |
| 5,673,103 A | 9/1997 | Inoue et al. |
| 5,677,757 A | 10/1997 | Taniguchi et al. |
| 5,684,566 A | 11/1997 | Stanton |
| 5,872,617 A | 2/1999 | Unno ................. 355/52 |
| 6,013,401 A | 1/2000 | McCullough et al. |
| 6,208,747 B1 | 3/2001 | Nguyen et al. |
| 6,292,255 B1 | 9/2001 | McCullough |
| 6,573,975 B2 * | 6/2003 | Govil et al. ................. 355/52 |

FOREIGN PATENT DOCUMENTS

| EP | 0 614 124 A2 | 9/1994 | ............ G03F/7/20 |
| EP | 0 844 529 A2 | 5/1998 | ............ G03F/7/20 |
| EP | 1 020 770 A2 | 7/2000 | ............ G03F/7/20 |

OTHER PUBLICATIONS

Copy of European Search Report, issued Jul. 9, 2004, 4 pages.

* cited by examiner

Primary Examiner—Alan Mathews
(74) Attorney, Agent, or Firm—Sterne, Kessler, Goldstein & Fox PLLC

(57) ABSTRACT

Linewidth variations and bias that result from MEF changes and reticle linewidth variations in a printed substrate are controlled by correcting exposure dose and partial coherence at different spatial locations. In a photolithographic device for projecting an image of a reticle onto a photosensitive substrate, an adjustable slit is used in combination with a partial coherence adjuster to vary at different spatial locations the exposure dose received by the photosensitive substrate and partial coherence of the system. The linewidth variance and horizontal and vertical or orientation bias are calculated or measured at different spatial locations with reference to a reticle, and a corrected exposure dose and partial coherence is determined at the required spatial locations to compensate for the variance in linewidth and bias on the printed substrate. Improved printing of an image is obtained, resulting in the manufacture of smaller feature size semiconductor devices and higher yields.

12 Claims, 10 Drawing Sheets

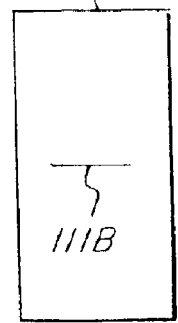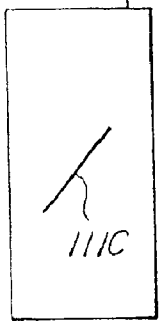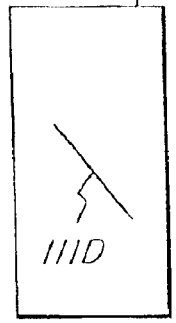
FIG. 3A   FIG. 3B   FIG. 4A   FIG. 4B
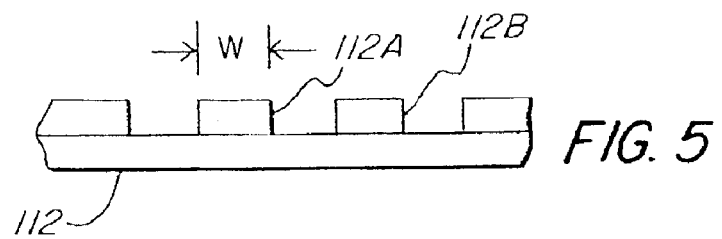
FIG. 5
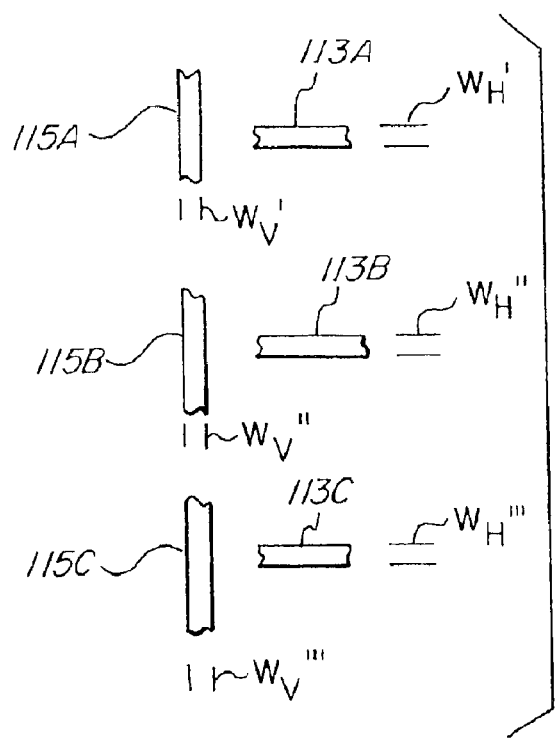
FIG. 6

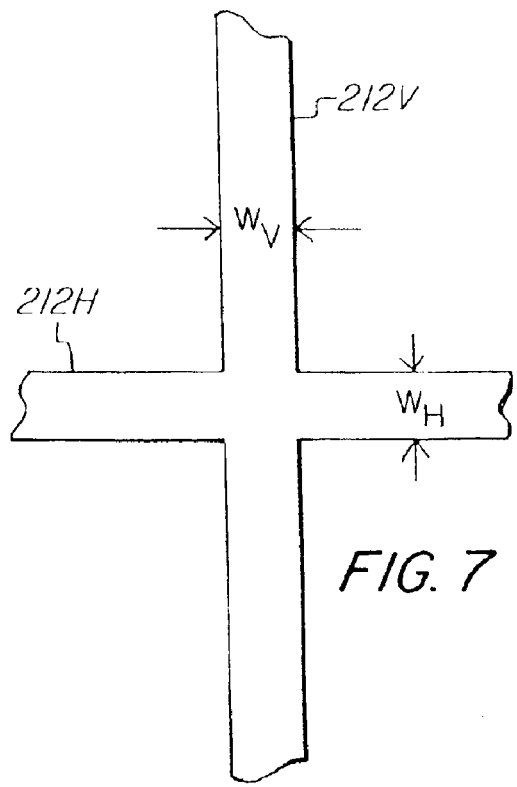
FIG. 7
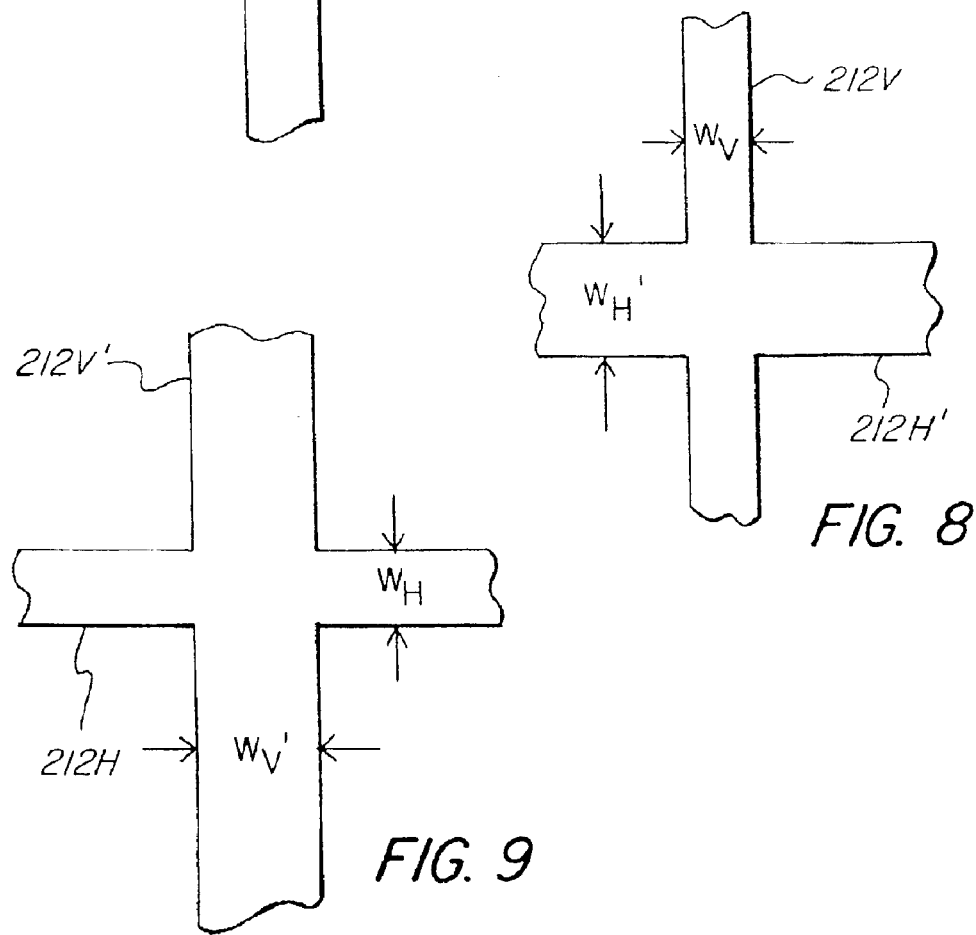
FIG. 8
FIG. 9

DUV SCANNER LINEWIDTH CONTROL BY MASK ERROR FACTOR COMPENSATION

This application is a continuation of Ser. No. 09/826,214, filed Apr. 4, 2001, now U.S. Pat. No. 6,573,975.

CROSS-REFERENCE TO RELATED APPLICATIONS

This application claims priority to application Ser. No. 09/826,214, filed on Apr. 4, 2001, entitled DUV SCANNER LINEWIDTH CONTROL BY MASK ERROR FACTOR COMPENSATION, which is incorporated by reference herein.

FIELD OF THE INVENTION

The present invention relates generally to photolithography, and particularly to an exposure system to control variations in linewidth in an image that is printed and used in the manufacture of semiconductor devices.

BACKGROUND OF THE INVENTION

In semiconductor manufacturing, the image of a reticle or mask is projected onto a photosensitive substrate or wafer. As semiconductor devices become ever smaller, the feature size of the images printed on the semiconductor device also become smaller. Correctly imaging and printing these small feature sizes onto a photosensitive substrate becomes increasingly difficult as the feature size is reduced. As the feature sizes approach the fraction of exposure wavelength, correct imaging is often difficult to obtain. There are many variables that determine the image quality and correct printing of a pattern on a reticle. The lines on a reticle to be reproduced may vary as a function of the feature size, type, and location in the field. The image may also vary as a function of the orientation or direction of the feature on the mask or reticle being imaged. There have been many attempts to improve the imaging characteristics of a photolithographic device to improve image quality and provide consistent printing. One such photolithographic system is disclosed in U.S. Pat. No. 5,383,000 entitled "Partial Coherence Varier For Microlithographic Systems" issuing to Michaloski et al. on Jan. 17, 1995, which is herein incorporated by reference. Therein disclosed is a microlithographic system utilizing an adjustable profiler that is actually movable along the optical axis in the illumination path for imposing a predetermined angular profile of the illumination. Another device for improving imaging in a photolithographic system is disclosed in U.S. Pat. No. 6,013,401 entitled "Method of Controlling Illumination Field To Reduce Linewidth Variation" issuing to McCullough et al. on Jan. 11, 2000, which is herein incorporated by reference. Therein disclosed is an dynamically adjustable slit for controlling the exposure dose at different spatial locations during a scanning exposure of a reticle. The adjustments in exposure are made in a direction perpendicular to the direction of scan of the illumination field. Another photolithographic system is disclosed in U.S. patent application Ser. No. 09/232,756 entitled "Dose Control For Correcting Linewidth Variation In The Scan Direction" filed Jan. 15, 1999, by McCullough, which is herein incorporated by reference. Therein disclosed is a device for varying the exposure dose as a function of distance in a scan direction for reducing linewidth variation. While these photolithographic systems and exposure devices and methods have improved image quality and the printing of features upon a photosensitive substrate, there is a need for yet further improvement, especially as the feature size is reduced and the need for better image quality and correct reproduction of the image on a photosensitive substrate.

SUMMARY OF THE INVENTION

The present invention is directed to a method and apparatus for correcting for printed feature size variations over a field by selectively adjusting the dose and partial coherence in a scanning photolithographic device. A scanning photolithographic device or tool comprises an illumination source forming an illumination field that is scanned, projecting the image of a mask or reticle onto a photosensitive substrate. The illumination field is adjusted to vary the exposure dose at predetermined spatial locations and an adjustable array optical element selectively varies at different spatial locations the numerical aperture of the illumination, thereby varying the partial coherence of the system.

Accordingly, it is an object of the present invention to improve the printing of features on a photosensitive substrate.

It is a further object of the present invention to correct for feature size variations resulting from the mask error factor.

It is yet a further object of the present invention to correct for reticle linewidth variations.

It is an advantage of the present invention that it is easily modifiable to accommodate different features to be printed.

It is a further advantage of the present invention that it reduces linewidth variances in printed features.

It is yet a further advantage of the present invention that it reduces horizontal and vertical bias in printed features.

It is a feature of the present invention that an adjustable slit is used to vary the exposure dose.

It is another feature of the present invention that an array optical element is used to vary the illumination numerical aperture and resulting partial coherence at different locations in the illumination field to minimize reticle feature variation induced horizontal/vertical bias.

These and other objects, advantages, and features will become readily apparent in view of the following more detailed description.

BRIEF DESCRIPTION OF THE DRAWINGS

FIG. 3A illustrates a reticle having a vertical feature.

FIG. 3B illustrates a reticle having a horizontal feature.

FIG. 4A illustrates a reticle having a feature oriented in a first direction.

FIG. 4B illustrates a reticle having a feature oriented in a second direction.

FIG. 5 is a cross section schematically illustrating lines lithographically produced on a substrate.

FIG. 6 schematically illustrates variable widths in a portion of a lithographically produced line.

FIG. 7 is a plan view schematically illustrating an orthogonal line pattern.

FIG. 8 is a plan view schematically illustrating a printed line pattern with horizontal bias.

FIG. 9 is a plan view schematically illustrating a printed line pattern with vertical bias.

DETAILED DESCRIPTION OF THE PREFERRED EMBODIMENTS

Figure 1:
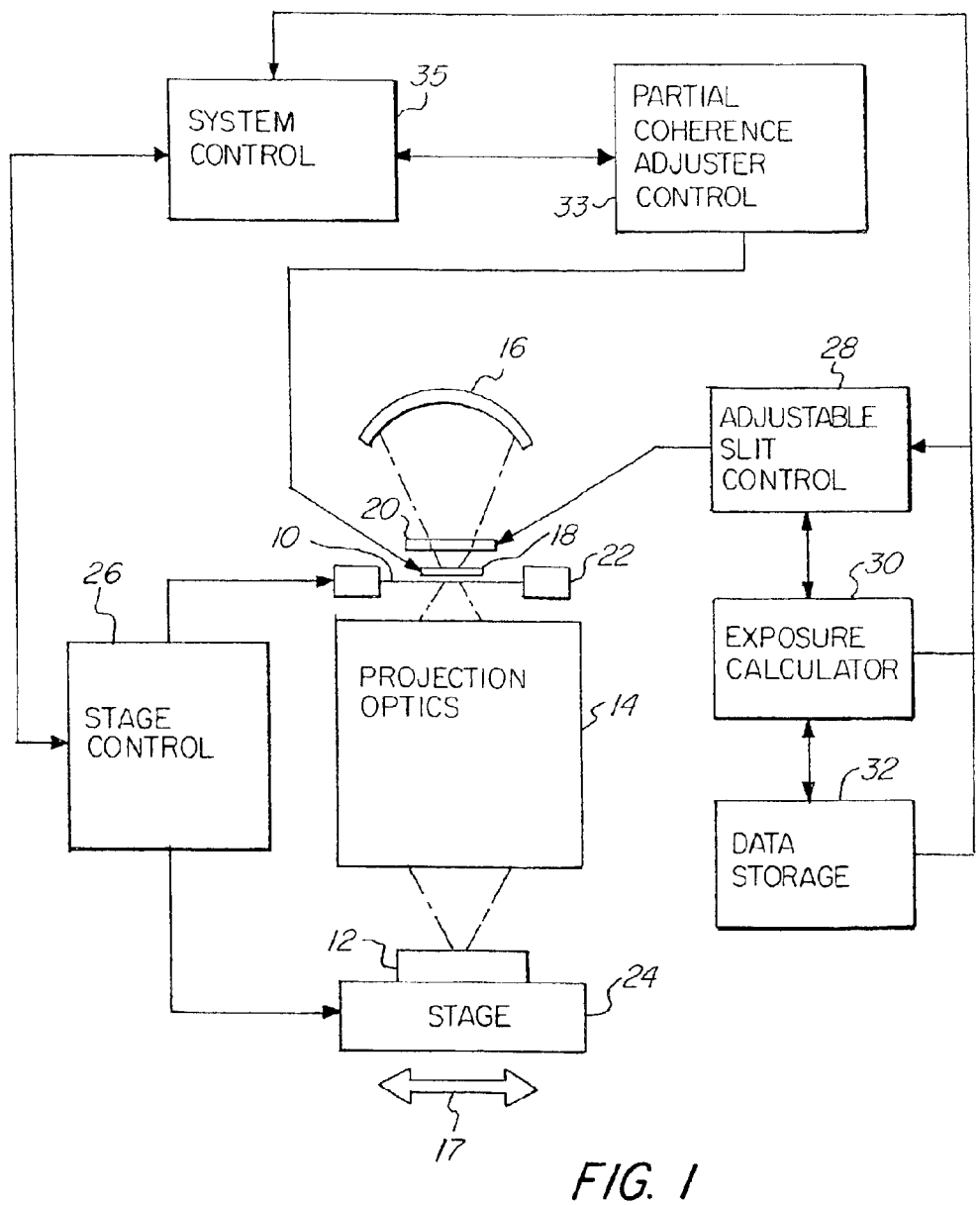
FIG. 1 schematically illustrates an embodiment of the present invention.

FIG. 1 schematically illustrates a photolithographic device of the present invention. A mask or reticle 10 having a pattern thereon is imaged onto a photosensitive substrate or wafer 12. The image of the mask or reticle 10 is projected through projection optics 14 onto the substrate 12. An illumination source or system 16 is used to project the image of mask or reticle 10 onto the photosensitive substrate 12. A partial coherence adjuster or array optical element 18 selectively varies the emerging numerical aperture of the illumination along the slit illumination field and in a scan direction and therefore adjusts the partial coherence of the system. Adjustable slit 20 forms an illumination field, which is scanned over the reticle 10. A mask stage 22 and a substrate stage 24 are controlled by the stage control 26 and moved in synchronization so that the illumination field formed by the adjustable slit 20 scans the entire reticle 10 to reproduce an image thereof on the photosensitive substrate 12. The mask or reticle stage 22 and the substrate stage 24 move in the direction of arrow 17. The adjustable slit 20 is controlled by an adjustable slit control 28. The adjustable slit control 28 is coupled to an exposure calculator 30 and a data storage device 32. The partial coherence adjuster 18 is coupled to a partial coherence adjuster control 33. The partial coherence adjuster control 33 controls the movement of the partial coherence adjuster to provide a predetermined adjustment to the partial coherence of the system. The partial coherence adjuster or optical element 18 may be similar to the optical element disclosed in U.S. patent application Ser. No. 09/599,383 entitled "Illumination System With Spatially Controllable Partial Coherence Compensating For Linewidth Variance In A Photolithographic System" filed by McCullough et al. on Jun. 22, 2000, which is herein incorporated by reference in its entirety. The partial coherence adjuster 18 may also be a gradient array with selected different portions being used to control the partial coherence of the illumination at predetermined locations in the illumination field and during scanning. The partial coherence adjuster may be moved or effectively moved with optical elements to select the desired portion for creating the partial coherence. A system control 35 is coupled to stage control 26, partial coherence adjuster control 33, adjustable slit control 28, exposure calculator 30, and data storage 32.

The embodiment of the invention illustrated in FIG. 1 allows for correction of feature size variations resulting from a mask error factor. If the mask error factor varies as a function of reticle feature size then the mask error factor causes deviation of the printed feature as a function of the feature size. The mask error factor may be defined by the following equation:

Mask Error Factor=Image Reduction Factor×Change in Wafer Linewidth/Change in Reticle Linewidth.

If the mask error factor is one or a constant, which is desirable, then calibration may be used to adjust linewidth.

The reticle linewidths are measured in the reticle plane and the wafer linewidths are measured in the wafer plane. The mask error factor causes the linewidths to print with different image reduction factors for different feature sizes and feature types. Linewidth variations at best focus over the usable depth of focus are influenced. The present invention reduces or eliminates the effect of the mask error factor by adjusting the exposure dose and partial coherence along the slot and scan directions. Linewidth control at best focus and through a given focus range for different orientations of a given feature type is therefore improved.

The mask error factor for a given feature type and orientation may be modeled or calculated from either aerial image measurements or lithographical measurements at as many different locations along the slot as needed based upon the significance of its variation along the slot. The mask error factor can be measured for different conditions of the photolithographic device or tool, such as pupil fill, partial coherence, numerical aperture, and for different operating conditions such as accumulated dose, number of fields per wafer, number of wafers per batch, among others. Once the features on the reticle, such as lines, contacts, are specified, the principal characteristics may be measured lithographically or by aerial image measurements. Modeling by software computer simulations with industrial standard modeling or other equivalent modeling techniques that are well known may be used. Generally, a feature size reduction from a reticle feature to a photosensitive substrate feature has a fixed image reduction factor, such as 4 to 1. However, other reduction factors are possible and often used. However, as the feature size varies around a nominal size, reduction factor may change. Departure from the nominal image reduction factor causes undesirable linewidth variations across the printed fields. As a result, feature size from the reticle is not consistently reproduced on the wafer with the nominal image reduction factor and is different for different feature sizes around the nominal value. However, once the reticle feature size variations around the nominal value are measured, they can be corrected by modifying the exposure dose at each point in the illumination field during the scanning exposure. This is accomplished by the use of the adjustable slit 20.

Knowing the resist characteristics and linewidth variation per unit dose change, the dose changes required to correct for different mask error factor effects at different feature sizes across the field, both longitudinally along the slot and in the scan direction, can be calculated. These calculations are then used to modify the dose during scanning to reduce or eliminate the effects of mask error factor on the printed linewidth. The printed linewidth error on the substrate or wafer may be calculated by the following equation:

Change in printed wafer Linewidth=[Mask Error Factor× Change in Reticle Linewidth]/Nominal Image Reduction Factor.

If the mask error factor is constant; that is, it does not vary with reticle feature size variation around the nominal, then it can be corrected by dose calibration or magnification control. When the mask error factor varies from one field location on the reticle to another, that is it changes as reticle feature size changes around the nominal, it cannot be corrected by the nominal dose calibration. The dose must then be varied as the reticle is scanned by the adjustable slit 20. Knowing the mask error factor and the reticle linewidth, reticle correction calculations can be made and applied during tool use for device manufacturing and characterization. If the mask error factor is the same for different feature types, then a correction can be made with the adjustable slit in a single exposure, assuming that different orientations have similar feature dimensions. The dose correction is calculated at each field location on the reticle. The reticle linewidth variation correction calculation may be made as follows:

$$MEF = m[\Delta CD_{wafer}/\Delta CD_{reticle}]$$

MEF is the Mask Error Factor and is defined for mask linewidth at each field location. Typically, MEF is equal to one. m is the Nominal Image Reduction Factor or NIRF. Therefore, $$[\Delta CD_{reticleH} \times MEF_H]/m = \Delta CD_{waferH} = \text{Predicted Horizontal linewidth on wafer}$$

$$[\Delta CD_{reticleV} \times MEF_V]/m = \Delta CD_{waferV} = \text{Predicted Vertical linewidth on wafer}$$

For $MEF_H$ approximately equal to $MEF_V = MEF$ at any given location in the field.

$$\Delta CD_{wafer} = (\Delta CD_{waferH} + \Delta CD_{waferV})/2 = MEF[\Delta CD_{reticleH} + \Delta CD_{reticleV}]/2M$$

Alternatively, if $MEF_H$ is not equal to $MEF_V$ then, $$\Delta CD_{wafer} = [(\Delta CD_{reticleH})MEF_H + (\Delta CD_{reticleV})MEF_V]/2M$$

$$\Delta \text{Dose Correction} = \Delta CD_{wafer}/\text{Dose sensitivity}$$

The ΔDose Correction is calculated at each location in the exposure field.

However, if there is a residual horizontal/vertical bias after the average linewidth is corrected as indicated above, that is (a) a horizontal feature is imaged differently than a vertical feature at the same location, or (b) a horizontal feature that is different than a vertical feature size on the reticle, then the mask error factor may be controlled with the partial coherence adjuster or array optical element 18 by modifying the partial coherence at different spatial locations in both a direction along the illumination slot and in the direction of scan. Alternatively, multiple exposures may be utilized such that features with different orientations can be printed in separate exposures with the dose controlled by the adjustable slit 20 set independently.

Linewidth variations can be corrected by calculating the horizontal and vertical feature size biases at each site on the reticle and by using the mask error factor control. Either by measurement or modeling, the printed horizontal features and printed vertical features may be calculated in the wafer plane. The horizontal and vertical bias may also be calculated in the wafer plane. The partial coherence variance required for correcting the horizontal and vertical bias can be calculated by techniques well known in the art and with the aid of commercial software that is readily available. The optical element 18 is then utilized to vary the partial coherence at each spatial location in the slit field to compensate for the horizontal and vertical bias. Once the partial coherence at the spatial location is determined, the partial coherence correction as provided by the partial coherence adjuster or optical element 18 may be applied.

Accordingly, the present invention may be utilized to correct for average reticle linewidth variations or to correct for horizontal and vertical bias variations, or to correct for both average reticle linewidth variations and horizontal and vertical bias variations, or to correct for horizontal linewidth variations only, or to correct for vertical linewidth variations only.

Figure 2:
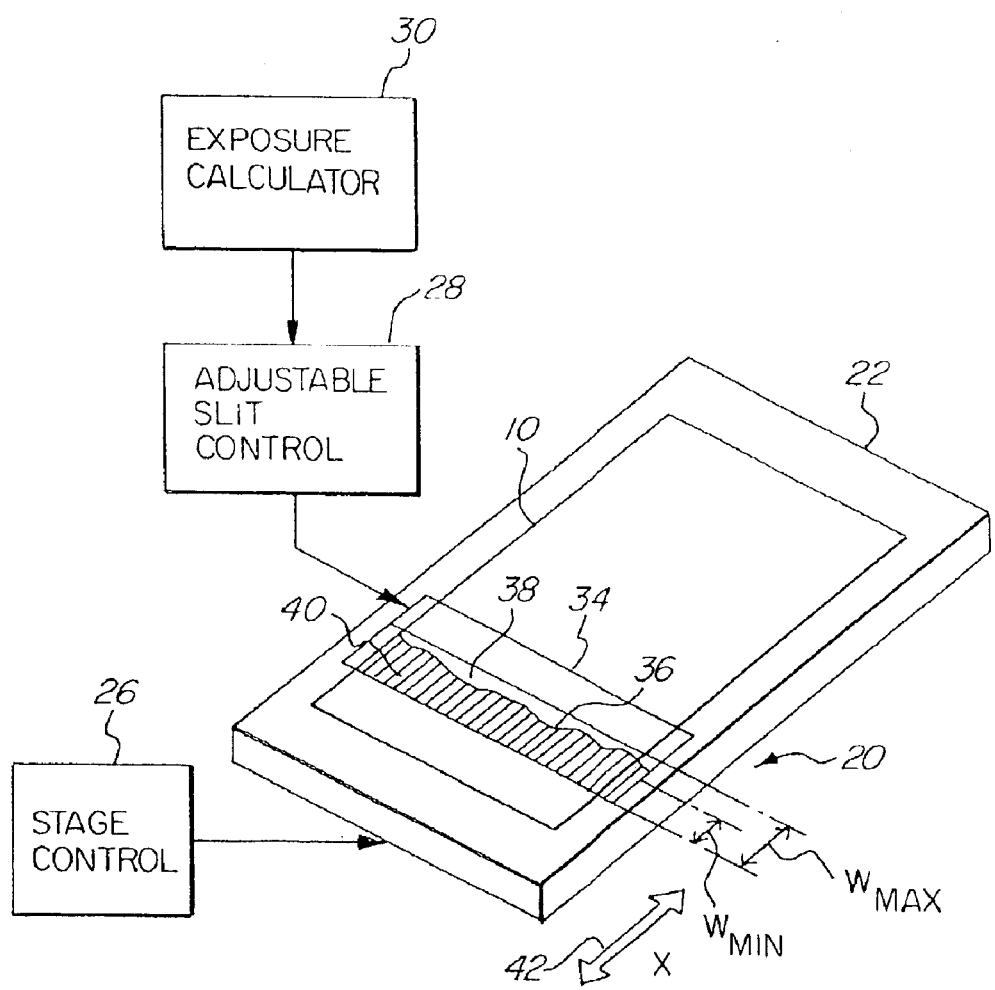
FIG. 2 schematically illustrates the adjustable slit illustrated in FIG. 1.

FIG. 2 schematically illustrates the adjustable slit 20 illustrated in FIG. 1. An illumination field 40 is created by an illumination adjuster 38 that creates an adjustable contour 36. The adjustable contour 36 in illumination adjuster 38 blocks portions of the substantially rectangular illumination field to adjust the width of the illumination field at different longitudinal positions. Therefore, the illumination field 40 will have a maximum width $W_{max}$ or a minimum width $W_{min}$. An adjustable contour drive 34 adjusts the adjustable contour 36. The adjustable contour drive 34 is controlled by the adjustable slit control 28.

In operation, the adjustable slit 20 modifies the exposure dose received by the photosensitive substrate 12, illustrated in FIG. 1. The substantially rectangular illumination field 40 is scanned in the direction of arrow 42 to project the image of the reticle 10 onto a photosensitive substrate. The reticle 10 is held in a reticle stage 22 and driven by a stage control 26 so as to scan the illumination field 40. As the illumination field 40 is scanned across the reticle 10, the adjustable slit control 28 controls the adjustable contour drive 34, causing the illumination adjuster 38 to vary the adjustable contour 36. The exposure calculator 30 is coupled to the adjustable slit control and is used to determine the correct exposure dose. Data storage 32 stores data relating to exposure dose required to obtain the desired change in linewidth.

Figure 2A:
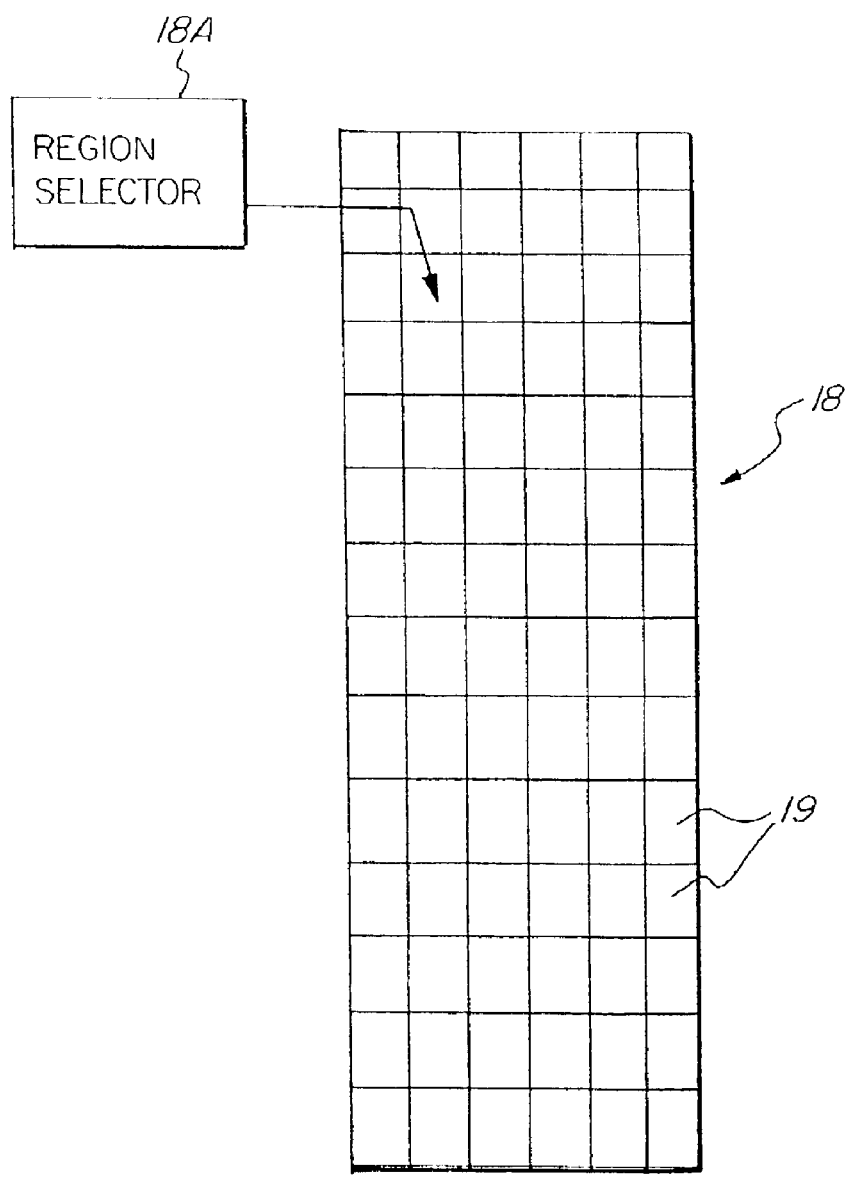
FIG. 2A schematically illustrates the partial coherence adjuster illustrated in FIG. 1.

FIG. 2A schematically illustrates the optical array element or partial coherence adjuster 18 illustrated in FIG. 1. The partial coherence adjuster or array optical element 18 is used to vary the emerging numerical aperture of the illumination source used to form the illumination field. This in turn varies the partial coherence, which is defined as the ratio formed by the numerical aperture of the illuminator optical system divided by the numerical aperture of the projection optical system. The partial coherence adjuster 18 is formed from a plurality of regions 19. Each region 19 may be made of a lens or plurality of lenses that modify the emerging numerical aperture or cone of illumination in a predetermined way. The different regions 19 may also be continuous or a gradient rather than discrete. The partial coherence adjuster or array optical element 18 is dynamic in the sense that it can select a portion of the reticle to provide a predetermined partial coherence. Therefore, a partial coherence change may be made at any pre-selected point in the illumination field depending upon the adjustment to be made to the printed image.

The partial coherence adjuster 18 may be fixed and the desired regions 19 optically selected by a region selector 18A. That is other optical elements may be positioned adjacent the desired region 19 to provide illumination for forming the desired partial coherence. The region selector 18A may be comprised of movable mirrors, prisms, fiber optic elements, adjustable slots or slits, or other well known optical elements or devises.

FIGS. 3A and 3B schematically illustrate reticles having different feature types. Reticle 110A has a vertical feature type 11A, and reticle 110B has a horizontal feature type 111B.

FIGS. 4A and 4B illustrate reticles having other different feature types. In FIG. 4A, a reticle 110C has a first feature type 111C thereon. In FIG. 4B, a reticle 110D has a second feature type 111D thereon. The first and second feature types 111C and 111D may be orientated at different angles relative to the reticle orientation. It should be appreciated that there are a large number of feature types that are found on different reticles. The feature types illustrated in FIGS. 3A–B and FIGS. 4A–B are illustrative of the different orientations of different feature types. Many feature types are primarily horizontal and vertical or orthogonal with respect to each other. Feature types may also include isolated and/or grouped features. Other examples include lines, contacts, and other well known features used in photolithography for the manufacture of semiconductor devices.

FIG. 5 schematically illustrates a cross section of a portion of a semiconductor device manufactured with a lithographic technique. Placed on substrate 112 is a first line 112A and a second line 112B. While only one layer is illustrated, typically many different layers are utilized depending upon the semiconductor device being manufactured. The first line 112A has a lateral width W and a space between adjacent lines 112A and 112B. However, the term linewidth may also be used to indicate the space between adjacent lines 112A and 112B.

FIG. 6 is a plan view of vertical lines 115A, 115B, 115C and horizontal lines 113A, 113B, 113C, similar to the lines illustrated in FIG. 5. The lines 115A–C and 113A–C are printed at various locations along the slot projected on the photosensitive substrate. The lines 115A–C and 113A–C are generally orthogonal to each other, but may have different orientations. Additionally, the linewidth should accurately reflect the linewidth of the reticle, which is imaged on the photosensitive substrate. However, with very small linewidths, of the order of the exposure wavelength or smaller, it is often very difficult to obtain the same linewidth across the slot as well as a linewidth that does not deviate from the linewidth on the reticle due to different photolithographic parameters or variables. Accordingly, the linewidths may have different widths $W'_V$, $W''_V$, $W'''_V$, $W'_H$, $W''_H$ and $W'''_H$ at different longitudinal locations along the slot projected onto the photosensitive substrate. The present invention, by controlling the dose with the adjustable slit 20, illustrated in FIGS. 1 and 2, reduces the variation in linewidth, especially as a function of feature size and location.

Additionally, there may be errors or variations of linewidth as a result of the manufacturing of the reticle. The present invention by selectively controlling the exposure dose and partial coherence at different locations in the exposure field along the slot can correct for manufacturing errors of the reticle. Therefore, a designed or intended linewidth can be printed even though an error in the linewidth on the reticle has occurred during manufacture of the reticle. This feature of the present invention can also reduce the required manufacturing tolerances of reticles, and therefore substantially reduce the manufacturing cost of producing reticles. For example, a reticle having reduced manufacturing tolerances may be made at reduced cost or a reticle that has some dimensional errors at different locations may still be used. The deviation from the proportioned dimensions of the reticle image to be reproduced may be compensated for by the present invention resulting in the reproduction of the desired image. By proportioned dimensions it is meant that the image of the reticle may be reduced by a reduction factor or magnification of less than one, for example a four to one reduction ratio. Therefore, even though the reticle has reduced manufacturing tolerances the desired image can still be reproduced.

FIGS. 7–9 illustrate the effect of horizontal and vertical bias in printing orthogonal linewidths. It should be appreciated that horizontal and vertical bias represents variations in linewidths between two horizontal and vertical orientations. Biases in other orientations are also applicable. FIG. 7 illustrates a horizontal line 212H having a width of $W_H$ and a vertical line 212V having a width of $W_V$. Width $W_H$ is substantially equal to width $W_V$. FIG. 8 illustrates printing of the line pattern illustrated in FIG. 7 with a photolithographic system having a horizontal bias at a particular location in the field. Due to the horizontal bias, horizontal line 212H' has a changed printed linewidth $W_{H'}$, while the vertical line 212V has substantially the same linewidth $W_V$ as illustrated in the line pattern in FIG. 7. Similarly, FIG. 9 illustrates printing of the line pattern illustrated in FIG. 7 with a photolithographic system having vertical bias at a particular location in the field. Due to the vertical bias, vertical line 212V' has a changed printed linewidth $W_{V'}$, while the horizontal line 212H has substantially the same linewidth $W_H$ as illustrated in the line pattern in FIG. 7. A photolithographic system may have a positive, wider linewidth, or a negative, narrower linewidth, bias or a combination of both horizontal and vertical bias at a single location. This horizontal and vertical bias will vary spatially within the field of the photolithographic system and may be different for each system.

This horizontal and vertical bias, along with other imaging characteristics of the photolithographic system, is often referred to as the signature of the photolithographic system. The signature of the photolithographic system may also include characteristic of the reticle being used for imaging. In compensating for horizontal/vertical bias introduced by the reticle and from mask error factor characteristics, the present invention utilizes the array optical element 18, illustrated in FIGS. 1 and 2A, to modify the partial coherence or fill geometry of the illumination to compensate for the horizontal and vertical bias at different locations where required to accurately print an image of the reticle.

Figure 10:
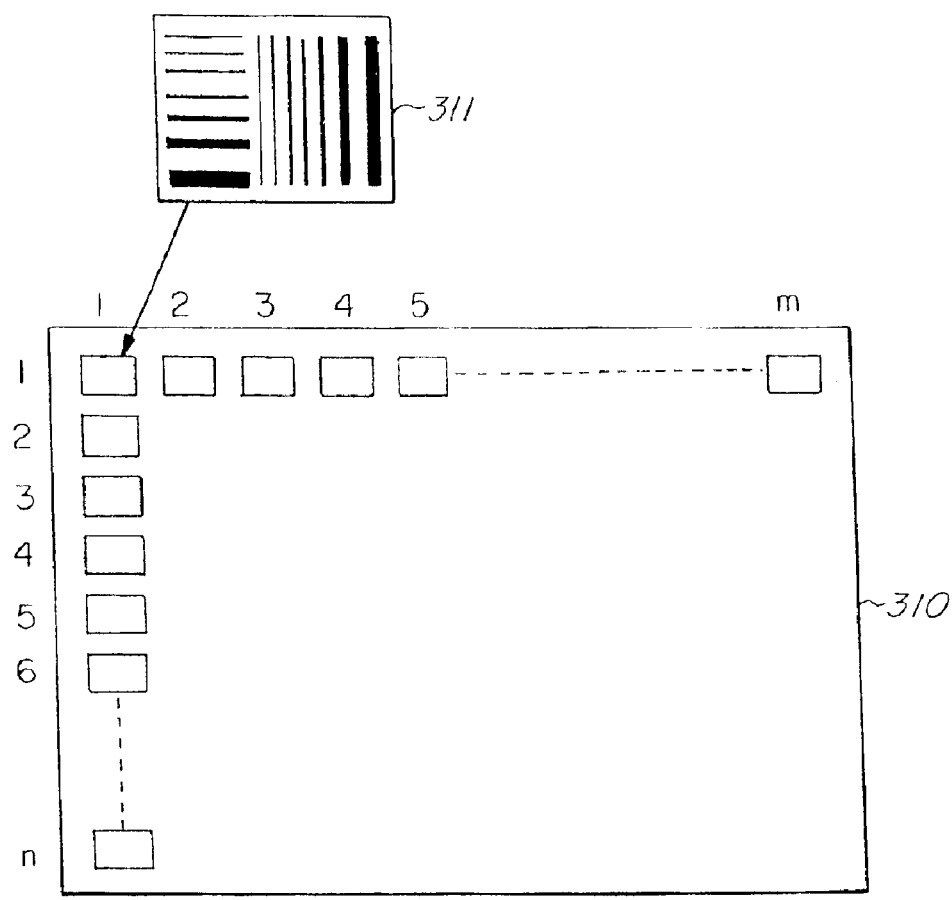
FIG. 10 is a plan view schematically illustrating a test reticle having different fields with different line widths.

FIG. 10 schematically illustrates a test reticle 310 having a plurality of m columns and n rows of a line pattern portion 311. The line pattern portion 311 has a plurality of different linewidth spacings and orientations. Each of the line pattern portions 310 is positioned in an array configuration on test reticle 310. The test reticle 310 is utilized to obtain the actual printed measurements to determine photolithographic system or tool mask error factor at different locations along the slot for given feature types and sizes around the nominal sizes.

Figure 11:
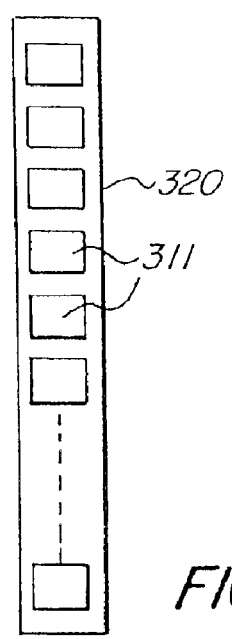
FIG. 11 is a plan view schematically illustrating different locations along a slit.

FIG. 11 illustrates the use of a slot or slit field 310 having corresponding line pattern portions 311 along the longitudinal lengths of the slit field 320. The line pattern portions or group features may be comprised of (a) varying linewidths for a constant pitch or (b) varying linewidths (i.e. varying pitch) having a 1:1 line/spacing duty cycle. The slot or slit field is scanned across the reticle 310, illustrated in FIG. 10. The actual tool mask error factor is then determined at various longitudinal locations along the slit field 320. This information is utilized to determine the appropriate exposure dose to be provided by the adjustable slit and the partial coherence to be provided by the array optical element in correcting for linewidth variation or any horizontal/vertical bias.

Utilizing this format or method data is available at multiple locations along the scan for a given slot position. This allows evaluation and correction for scan signature and also for a given feature type and size.

Figure 12:
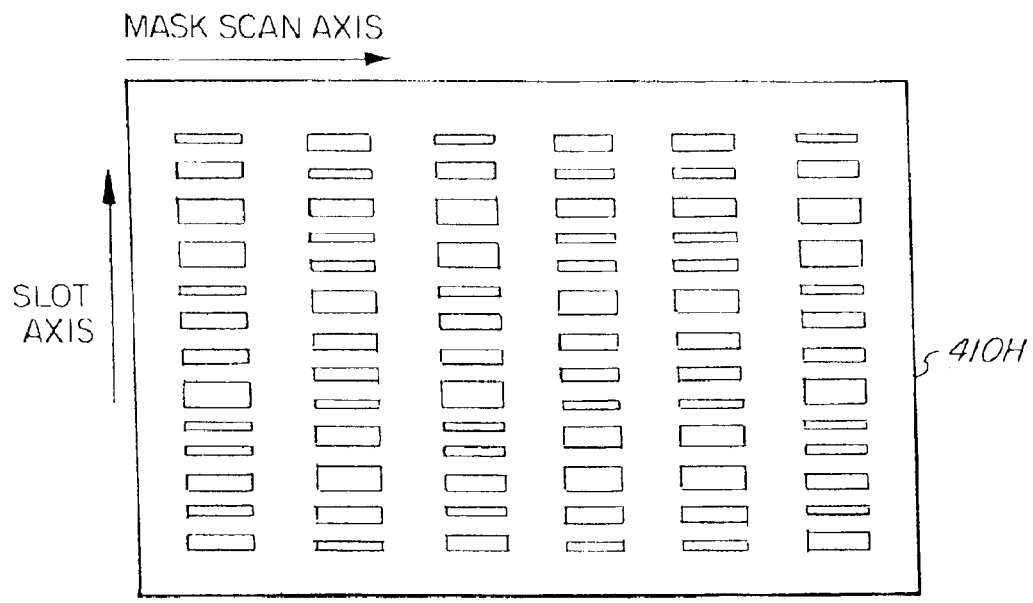
FIG. 12 is a plan view schematically illustrating a reticle having different horizontal features at different spatial locations.

FIG. 12 graphically or schematically illustrates different horizontal feature sizes located at different spatial locations on a reticle 410H.

Figure 13:
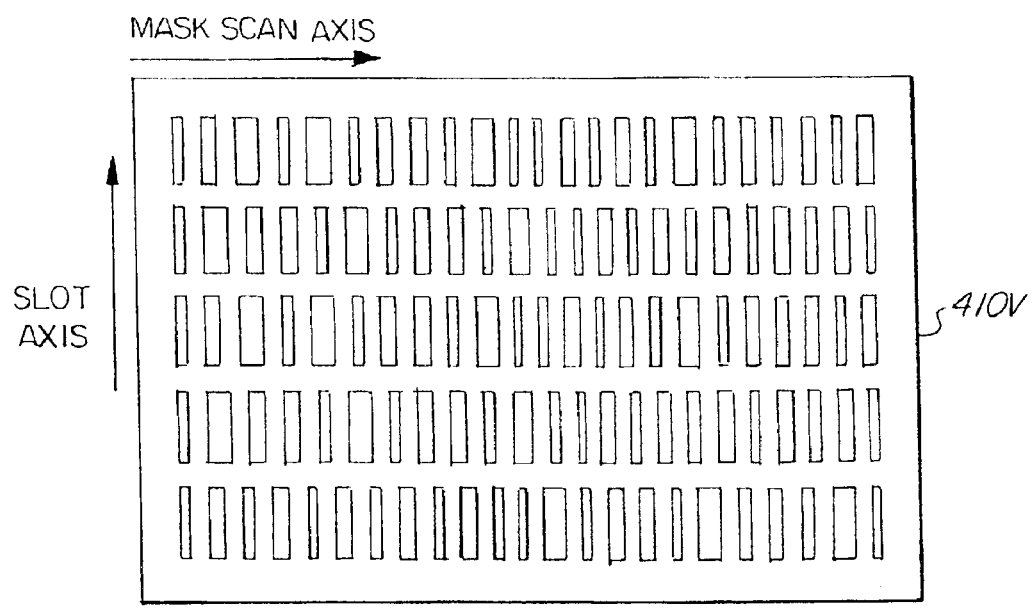
FIG. 13 is a plan view schematically illustrating a reticle having different vertical features at different spatial locations.

FIG. 13 graphically or schematically illustrates different vertical feature sizes located at different spatial locations on a reticle 410V.

The different horizontal and vertical feature sizes are often combined in the features of a single reticle. FIGS. 12 and 13 are intended to illustrate the different features have horizontal and vertical components.

Figure 14:
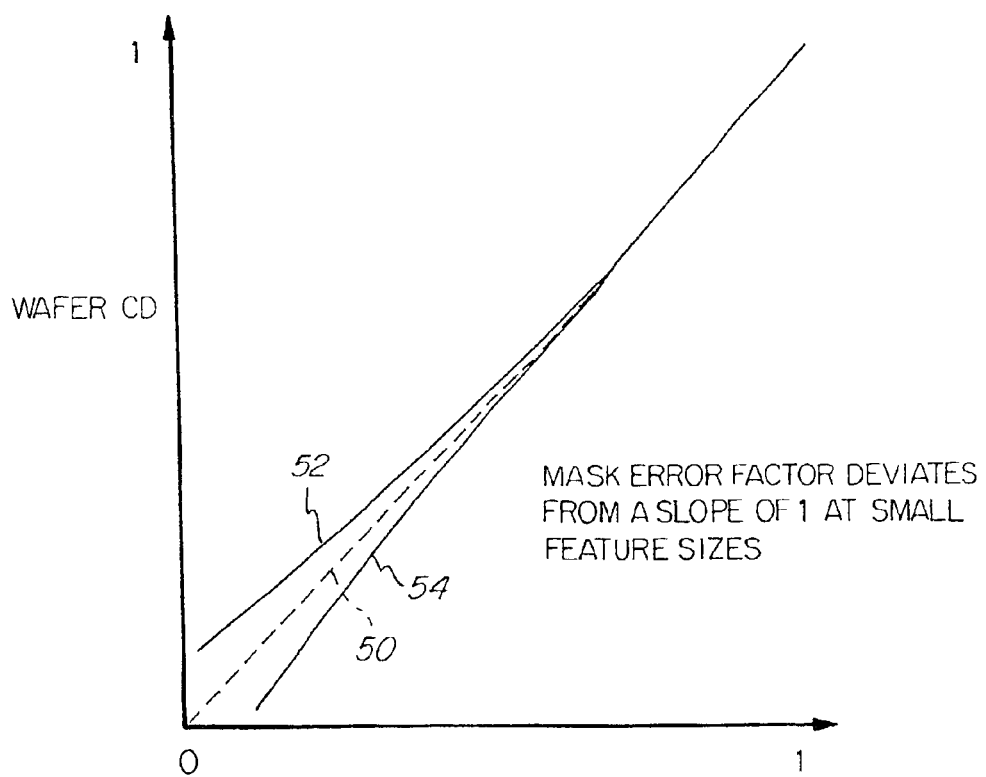
FIG. 14 is a graph illustrating the mask error factor.

FIG. 14 is a graph illustrating the mask error factor. Dashed line 50 represents a slope of one indicating that the reticle critical dimension is the same as the wafer critical dimension and therefore there is no mask error factor related correction required during an exposure. Line 52 represents a mask error factor for relatively small features when the feature reproduced on the substrate or wafer is oversized relative to the feature being reproduced from the reticle. Line 54 represents the mask error factor for relatively small features when the feature reproduced on the substrate or wafer is undersized relative to the feature being reproduced from the reticle. It should be noted that the mask error factor increases substantially as the feature size becomes smaller. Accordingly, the present invention, in correcting for mask error factor and the related imaging problems, becomes much more important as the feature size becomes smaller for a given technology node.

Figure 15:
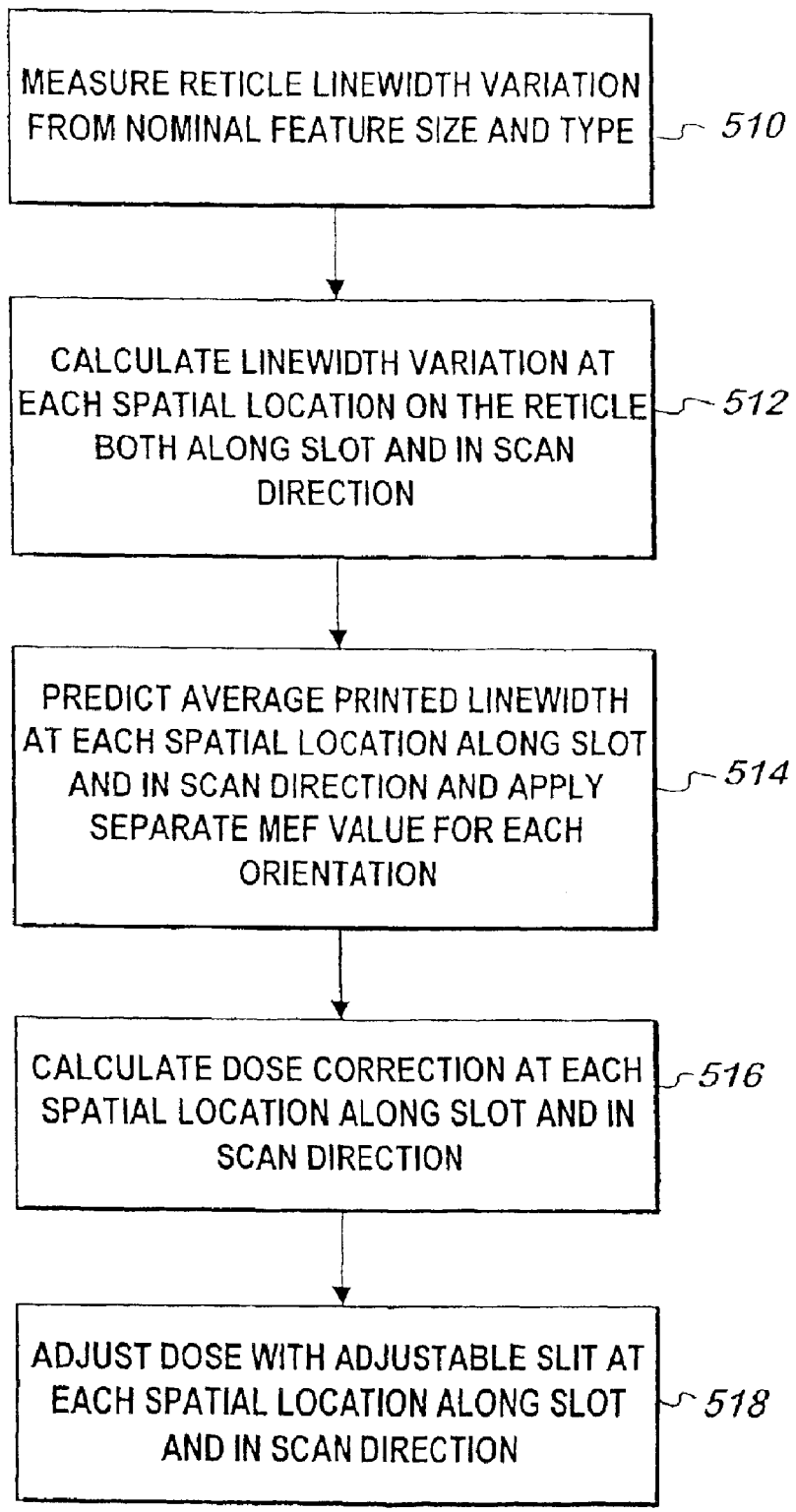
FIG. 15 is a block diagram illustrating the method steps of an embodiment of the present invention for adjusting exposure dose.

FIG. 15 is a block diagram illustrating the method steps of an element of the present invention. FIG. 15 illustrates the method steps utilized in correcting for the exposure dose to reduce linewidth variation. Box 510 represents the step of measuring reticle linewidth variation from the nominal feature size and type. Box 512 represents the step of calculating the predicted wafer or printed linewidth variation at each spatial location for different orientations. This calculation can be accomplished utilizing the following equations:

$$[\Delta CD_{reticleH} \times MEF_H]/m = \Delta CD_{waferH} = \text{Predicted horizontal linewidth at wafer}$$

$$[\Delta CD_{reticleV} \times MEF_V]/m = \Delta CD_{waferV} = \text{Predicted Vertical linewidth on wafer}$$

Box 514 represents the step of predicting the average printed wafer linewidth. This can be performed by the following equation:

$$\Delta CD_{wafer} = (\Delta CD_{waferH} + \Delta CD_{waferV})/2$$

Wherein, $\Delta CD_{wafer}$ is the average of the horizontal and vertical linewidths.

Box 516 represents the step of calculating the dose correction at each spatial location. This can be accomplished by the following equation:

$$\Delta \text{Dose Correction} = \Delta CD_{wafer}/\text{Dose sensitivity}$$

The dose correction is for a given feature, resist and type.

Box 518 represents the method step of adjusting the dose with the adjustable slit at each spatial location. This step then compensates or corrects the exposure dose to obtain a reduced variation of linewidth based on the calculations from the prior method steps.

Figure 16:
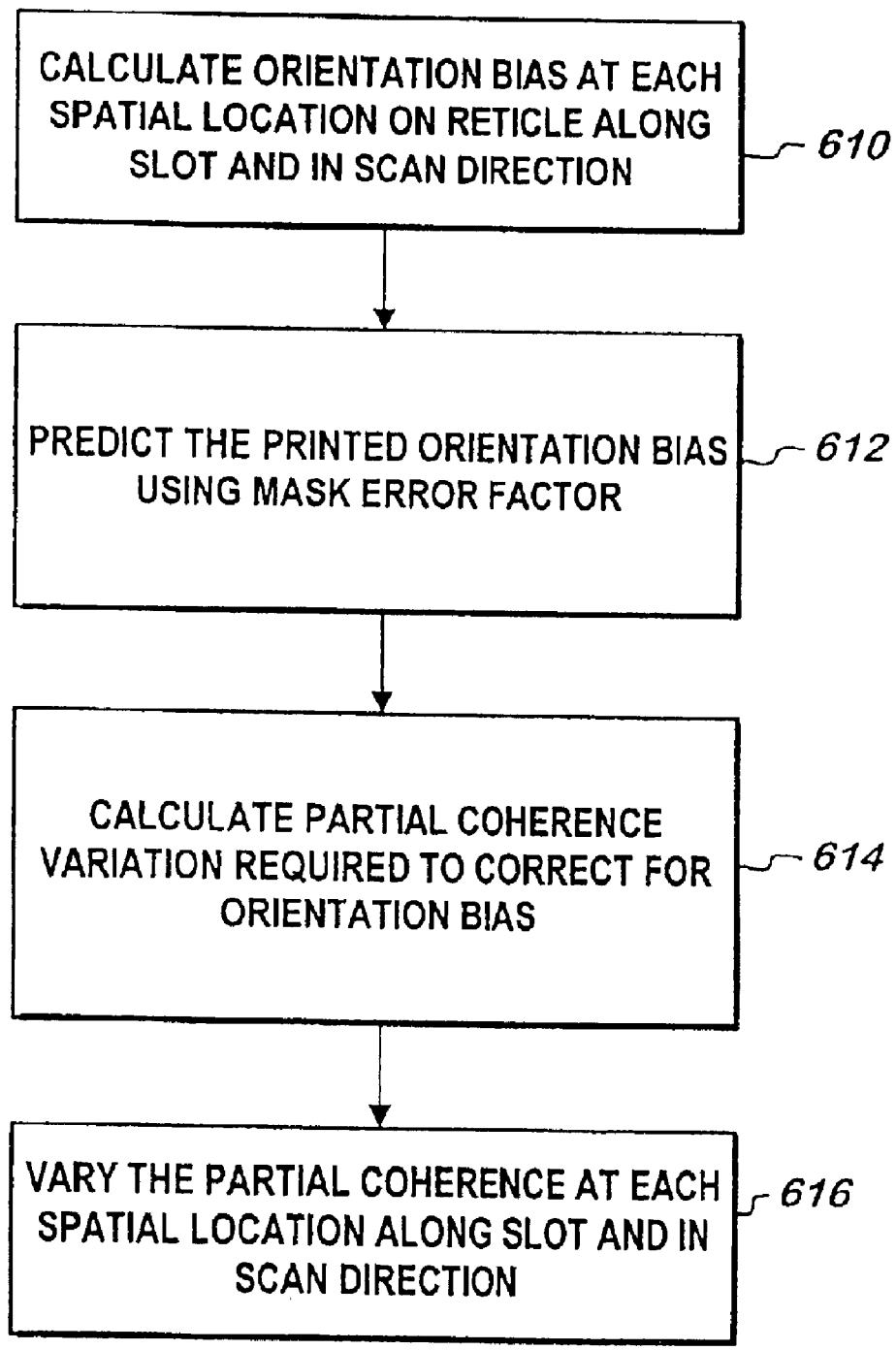
FIG. 16 is a block diagram illustrating the method steps of an embodiment of the present invention for correcting horizontal bias by varying partial coherence.

FIG. 16 is a block diagram illustrating an element of the present invention. FIG. 16 represents the method steps or acts utilized in modifying the partial coherence of illumination to compensate for horizontal and vertical bias. Box 610 represents the method step or act of calculating the horizontal/vertical bias at each spatial location on the reticle. Box 612 represents the step or act of predicting the printed horizontal/vertical bias using the mask error factor. The horizontal and vertical bias may be measured or obtained based on calculations or modeling. Box 614 represents the method step of calculating the partial coherence variation required to correct for the horizontal and vertical bias. This can be done by using various calculation methods or commercially available software, such as Prolith software. Box 616 represents the method step of varying the partial coherence at each spatial location based on the calculation of the required partial coherence change or variation in order to obtain the required correction for horizontal/vertical bias. Modifying or changing the array optical element associated with the illumination source can accomplish this. The array optical element may also be dynamic or movable in a plane, as illustrated in FIG. 2A.

By combining the methods illustrated in FIGS. 15 and 16, improved printing can be obtained. Accordingly, by correcting both the dose at different spatial locations and the partial coherence at different spatial locations, variations in linewidth can be compensated for, as well as horizontal and vertical bias. Therefore, the present invention provides an apparatus and method that is utilized with photolithographic devices used in the manufacture of semiconductors to improve quality and yield. The present invention permits the imaging and printing of much smaller features or elements that may not be possible or easily obtained using current techniques. Therefore, the present invention advances the photolithographic arts and the manufacture of semiconductors associated therewith.

The term horizontal and vertical bias is used to mean a change in printed linewidth as a result of differences in orientation. While the linewidths are typically perpendicular to one another, horizontal or vertical, the linewidths may have any relative orientation. Therefore, the term horizontal and vertical bias may be used interchangeably with orientation bias.

Although the preferred embodiments have been illustrated and described, it will be apparent to those skilled in the art that various modifications may be made without departing from the spirit and scope of this invention.

What is claimed is:

1. A photolithographic device comprising:
    a partial coherence adjuster receiving electromagnetic radiation from a source;
    an adjustable slit receiving electromagnetic radiation from said partial coherence adjuster;
    a reticle stage that holds a reticle;
    a substrate stage; and
    projection optics between said reticle stage and said substrate stage,
    whereby a dose of electromagnetic radiation received at said substrate stage is controlled by said adjustable slit, and a partial coherence of said electromagnetic radiation is modified at selected portions of said reticle by said partial coherence adjuster to control linewidth variation.

2. The photolithographic device of claim 1, wherein said partial coherence adjuster comprises an array optical element.

3. The photolithographic device of claim 2, further comprising a region selector associated with said array optical element, whereby a partial coherence may be changed at any predetermined spatial location.

4. The photolithographic device of claim 2, wherein said array optical element has a plurality of emerging numerical aperture modifying regions.

5. A scanning photolithographic device comprising:

an array optical element having a plurality of emerging numerical aperture modifying regions that receive electromagnetic radiation;

an adjustable slit that receives electromagnetic radiation emerging from said array optical element;

a reticle stage that holds a reticle;

a substrate stage;

projection optics between said reticle stage and said substrate stage; and an controller coupled to said adjustable slit, whereby a dose of electromagnetic radiation directed towards said substrate stage is controlled by said controller, and said array optical element modifies an emerging numerical aperture at selected portions of the reticle to control linewidth variation.

6. The scanning photolithographic device of claim 5, further comprising a region selector associated with said array optical element for changing said emerging numerical aperture and resulting partial coherence at predetermined spatial locations.

7. The scanning photolithographic device of claim 5, wherein said adjustable slit has a variable width along a longitudinal length.

8. The scanning photolithographic device of claim 5, further comprising a test reticle having a plurality of line pattern portions with lines of different linewidths and orientations spatially positioned.

9. The scanning photolithographic device of claim 5, further comprising means, associated with a substrate mounted on said substrate stage, for determining the variations of linewidth on said substrate when processed.

10. A scanning photolithographic device comprising:

an optical element having a plurality of emerging numerical aperture modifying regions and comprising a gradient, said optical element receiving electromagnetic radiation from an illumination source and providing a predetermined partial coherence at selected locations on a reticle that is mounted on a reticle stage;

a region selector that redirects said plurality of emerging numerical aperture modifying regions at predetermined locations;

an adjustable slit that receives electromagnetic radiation from said optical element and having a variable width along its longitudinal dimension;

a reticle stage that holds said reticle;

a substrate stage that holds a substrate thereon;

projection optics between said reticle stage and said substrate stage;

a stage control coupled to said reticle stage and said substrate stage;

an adjustable slit control coupled to said adjustable slit; and a system control coupled to said stage control, said region selector, and said adjustable slit control, whereby a dose of electromagnetic radiation received by said substrate is controlled by said adjustable slit, and said optical element modifies said selected partial coherence at predetermined spatial locations on said reticle to control linewidth variation.

11. The photolithographic device of claim 10, further comprising a region selector associated with said optical element, whereby a partial coherence may be changed at any predetermined spatial location.

12. The photolithographic device of claim 10, wherein said optical element is an array optical element.

* * * * *